US008093157B2

(12) United States Patent
Diao et al.

(10) Patent No.: US 8,093,157 B2
(45) Date of Patent: Jan. 10, 2012

(54) ADVANCED PROCESSING TECHNIQUE AND SYSTEM FOR PRESERVING TUNGSTEN IN A DEVICE STRUCTURE

(75) Inventors: Li Diao, Fremont, CA (US); Songlin Xu, Fremont, CA (US)

(73) Assignee: Mattson Technology, Inc., Fremont, CA (US)

( * ) Notice: Subject to any disclaimer, the term of this patent is extended or adjusted under 35 U.S.C. 154(b) by 649 days.

(21) Appl. No.: 11/773,382

(22) Filed: Jul. 3, 2007

(65) Prior Publication Data

US 2009/0011615 A1   Jan. 8, 2009

(51) Int. Cl.
*H01L 21/302* (2006.01)
*H01L 21/461* (2006.01)
(52) U.S. Cl. .. 438/725; 438/710; 438/798; 257/E21.483
(58) Field of Classification Search ........... 438/725, 438/798; 257/E21.483
See application file for complete search history.

(56) References Cited

U.S. PATENT DOCUMENTS

| | | | |
|---|---|---|---|
| 6,096,595 A * | 8/2000 | Huang | 438/238 |
| 6,218,085 B1 | 4/2001 | Molloy et al. | |
| 6,479,396 B1 | 11/2002 | Xu et al. | |
| 7,101,777 B2 | 9/2006 | Ho et al. | |
| 7,151,060 B2 | 12/2006 | Roters et al. | |
| 7,799,685 B2 | 9/2010 | Savas et al. | |
| 2001/0005622 A1 | 6/2001 | Kim et al. | |
| 2004/0084150 A1 * | 5/2004 | George et al. | 156/345.39 |
| 2005/0158667 A1 * | 7/2005 | Nguyen et al. | 430/322 |
| 2005/0196967 A1 | 9/2005 | Savas et al. | |
| 2006/0144817 A1 * | 7/2006 | Balasubramaniam et al. | 216/59 |
| 2008/0146041 A1 * | 6/2008 | Sasaki | 438/772 |

OTHER PUBLICATIONS

Kirchner et al., "Selective Oxidation of Advanced Gate Stacks with Tungsten Electrode", Mar. 2007, Semiconductor Manufacturing.
Debra Vogler, Mattson Extends Selective Oxidation to Advanced Gate Stacks, Solid State Technology, Oct. 26, 2006.
Georg Roters et al., Selective Oxidation of Tungsten-Gate Stacks in High Volume Dram Production, 203rd Meeting of the Electrochemical Society, Apr. 27-May 2, 2003, ECS2003_#941, Germany.
John H. Das et al., Single Wafer Atmospheric Pressure Rapid Thermal Process for Selective Oxidation of Silicon, 8th International Conference on Advanced Thermal Processing of Semiconductors-RTP '2000, Sep. 18-21, 2000.
Nobuyoshi Kobayashi, et al., A Novel Tungsten Gate Technology for VLSI Applications, Symposium on VLSI Technology, Sep. 13-15, 1983, Tokyo, Japan.

* cited by examiner

*Primary Examiner* — Angel Roman
(74) *Attorney, Agent, or Firm* — Pritzkau Patent Group, LLC

(57) ABSTRACT

Removing photoresist from a workpiece is described when a region of tungsten is exposed. A plasma is generated from a gas input consisting essentially of hydrogen gas and oxygen gas in a predetermined ratio. The plasma causes the photoresist to be removed from the workpiece while the region of tungsten is left substantially unmodified. The ratio of the hydrogen to oxygen can be adjusted to a particular value which causes the photoresist to be removed at about a maximum removal rate that corresponds to a minimum tungsten loss rate of about zero. Polysilicon oxidation in the presence of tungsten is described with little or no tungsten loss.

14 Claims, 5 Drawing Sheets

ADVANCED PROCESSING TECHNIQUE AND SYSTEM FOR PRESERVING TUNGSTEN IN A DEVICE STRUCTURE

BACKGROUND

The present invention is generally related to the fabrication of electronic devices and, more particularly, to the fabrication of electronic devices that incorporate one or more layers of tungsten in their structure.

The trend in decreasing device sizes in the production of integrated electronic circuitry is continuing in association with a need for high performance and reliability. One aspect of development relates to the structure of the gate electrode of a transistor such as a MOSFET in these devices. In the past, it has been acceptable to use a polysilicon stack that includes doped polysilicon. Unfortunately, for upcoming technology nodes where silicon oxide gate dielectric is replaced by dielectric materials having a high k dielectric constant, the polysilicon gate stack is not likely to be acceptable due to the mismatch of work functions between the gate dielectric and the electrode materials. The consequence of this mismatch causes the polysilicon gate stack to exhibit a resistance that is unacceptably high. The current trend, therefore, is to incorporate the use of new materials with improved conductivity. One example of an acceptable material is tungsten. Unfortunately, however, many process regimes that are currently in use are not readily applicable to the formation of a gate electrode structure that includes tungsten or even tungsten in some combination with polysilicon. As one example, for a photoresist (PR) strip process on a tungsten gate structure using plasma reactors, it has been found that a conventional oxygen plasma causes serious tungsten oxidation which leads to a degradation of device performance. Accordingly, it is considered that one of ordinary skill in the art would be motivated to avoid the use of oxygen, in order to avoid this oxidation. As an alternative, one might use a reducing chemistry including hydrogen to prevent the oxidation. Hydrogen itself, however, strips PR at an impractically slow rate, and it may introduce safety issues. Moreover, it is believed that many prior art process regimes which utilize hydrogen gas as a plasma constituent are limited as a result of employing forming gas to provide the hydrogen gas. Forming gas typically includes 4% hydrogen gas and 96% nitrogen gas. While the use of forming gas reduces risks associated with the flammability of hydrogen gas and increases PR strip rate, it is believed that the essentially vast amount of nitrogen gas that carries the hydrogen gas introduces significant limitations with respect to processing results that have been demonstrated in the prior art, as will be discussed at an appropriate point hereinafter.

In view of the foregoing, it is considered that there remains an unfulfilled need with respect to fabrication of integrated devices that incorporate tungsten. The present invention is considered to resolve the foregoing concerns while providing still further advantages.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In one embodiment, removing photoresist from a workpiece is described during an intermediate stage of processing when a region of tungsten is exposed as part of the workpiece. An associated system is configured to apply the process embodiment as described herein. A plasma is generated from a gas input consisting essentially of hydrogen gas and oxygen gas in a predetermined ratio. The workpiece is exposed to the plasma such that the predetermined ratio causes the photoresist to be substantially removed from the workpiece while the region of tungsten is left substantially the same as prior to the exposure to the plasma. In one feature, the plasma is nitrogen free or at least approximately nitrogen free. In this regard, some naturally occurring amount of nitrogen may be essentially unavoidable. In another feature, the gas input includes no more than approximately 30% hydrogen.

In another embodiment, removing photoresist from a workpiece is described during an intermediate stage of processing when a region of tungsten is exposed as part of the workpiece. An associated system is configured to apply the process embodiment as described herein. A downstream plasma system exposes the workpiece to a downstream plasma. A gas mixture is fed to the downstream plasma system for generating the downstream plasma and exposing the workpiece to the downstream plasma. A hydrogen gas and oxygen gas are used as the gas mixture for generating the downstream plasma to remove the photoresist such that a removal rate of the photoresist changes with changes in a ratio of the hydrogen gas to the oxygen gas and a loss of the tungsten during the removal of the photoresist changes with changes in the ratio. The ratio of the hydrogen gas to the oxygen gas is adjusted to a particular value which causes the photoresist to be removed at about a maximum removal rate that corresponds to a minimum tungsten loss rate of about zero. In one feature, the gas mixture may consist of hydrogen gas and oxygen gas.

In another embodiment, selective oxidation of polysilicon on a workpiece is described during an intermediate stage of processing when a region of tungsten is exposed as part of the workpiece. An associated system is configured to apply the process embodiment as described herein. A downstream plasma system exposes the workpiece to a downstream plasma. A plasma is generated from a gas input consisting essentially of hydrogen gas and oxygen gas in a predetermined ratio. The workpiece is exposed to the plasma such that the predetermined ratio causes the polysilicon to be oxidized while the region of tungsten is left substantially the same as prior to the exposure to the plasma. In one feature, the plasma is nitrogen free or at least approximately nitrogen free.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be illustrative rather than limiting.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiment shown, but is to be accorded the widest scope consistent with the principles and features described herein including alternatives, modifications and equivalents, as defined within the scope of the appended claims. It is noted that the drawings are not to scale and are diagrammatic in nature in a way that is thought to best illustrate features of interest. Descriptive terminology such as, for example, upper/lower, right/left, front/rear and the like may be adopted for purposes of enhancing the reader's understanding, with respect to the various views provided in the figures, and is in no way intended as being limiting.

Figure 1:
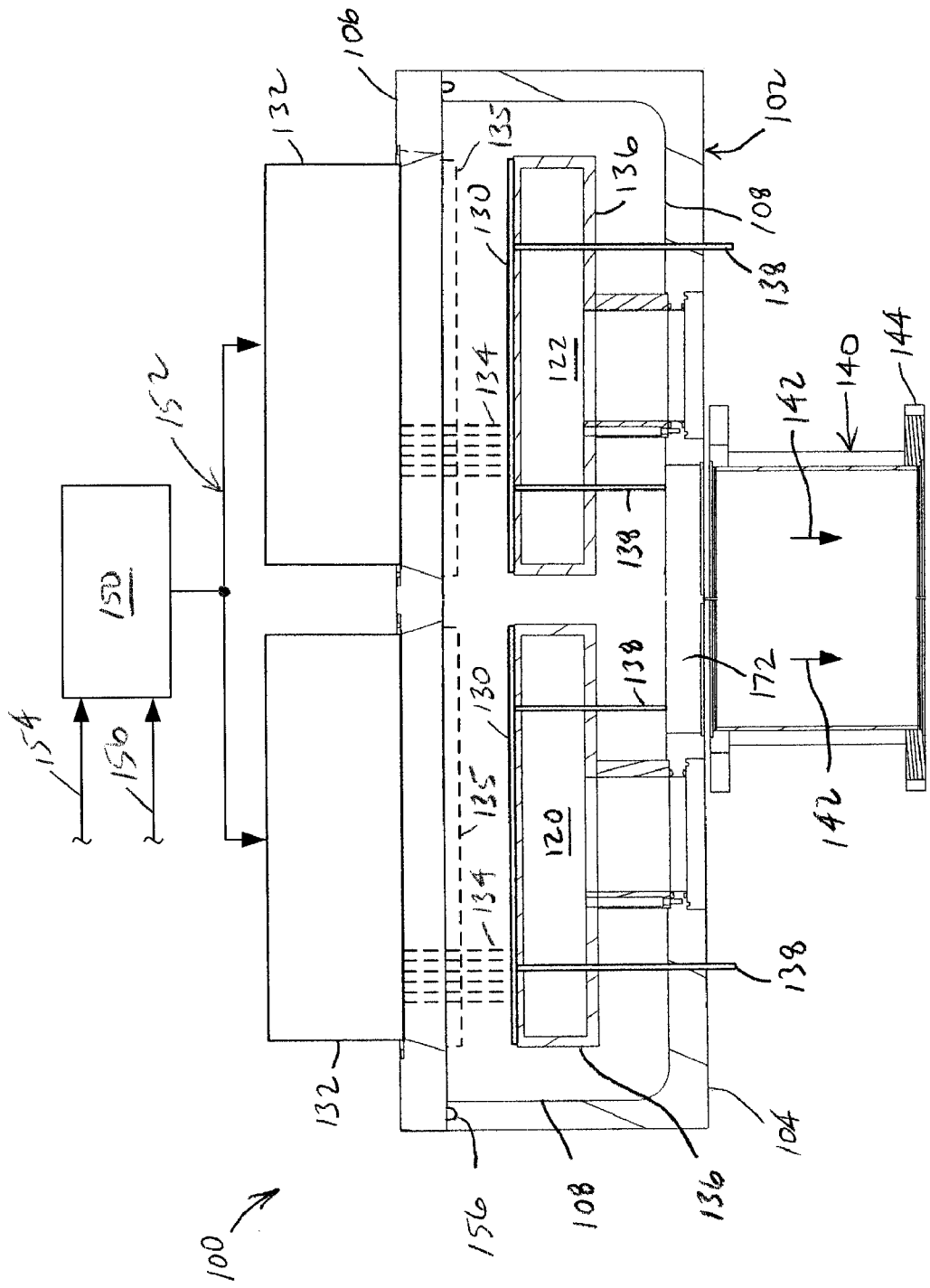
FIG. 1 is a diagrammatic partially cut-away view, in elevation, of one embodiment of a processing system that can be used in the context of the present disclosure for processing workpieces.

FIG. 1 is a diagrammatic view, in elevation, of one embodiment of a semiconductor processing system, generally indicated by the reference number 100, that is configured for the application of the process embodiments described herein. It is to be understood that other forms of systems may be utilized and the presently illustrated implementation is not intended as being limiting. A processing chamber arrangement 102 forms part of system 100 and is illustrated having a front portion cut away in order to reveal the chamber interior configuration. Of course, there must be a provision for transferring workpieces into and out of processing chamber arrangement 102. Slit doors and associated valves may be used for this purpose.

Still referring to FIG. 1, chamber arrangement 102 is made up of a chamber 104, which may be referred to as a chamber bowl, and a chamber lid 106. The latter may be hingedly attached to the chamber bowl. The chamber lid and chamber bowl cooperate to define a chamber interior or cavity 108 that is isolatable from ambient pressure. A first processing station 120 and a second processing station 122 are positioned in chamber interior 108. For purposes of the present example, system 100 will be described in the context of a semiconductor workpiece 130, although one of ordinary skill in the art will appreciate that this system and the method described below are readily used with other forms of workpieces such as, for example, discrete electronic components including diodes or capacitors, optoelectronic devices, micro-electromechanical systems (MEMS), flat panel displays and the like. Accordingly, for purposes of the present example, a pair of plasma sources, each individual one of which is indicated by the reference number 132, is provided. For purposes of photoresist removal, inductively coupled plasma (ICP) sources may be used such that one source is associated with each of the processing stations so as to generate a plasma 134 which is represented by a number of dashed lines. Other suitable plasma sources include, but are not limited to microwave sources, surface wave plasma sources, ECR plasma sources, and capacitively coupled (parallel plate) plasma sources. Baffles 135, shown using dashed lines, may be provided in order to implement a downstream plasma configuration such that ionized particles (i.e., charged species) are removed from the plasma. In this way, the workpiece is primarily exposed to neutral species from the plasma. In another useful form of downstream implementation (not shown), the plasma source can be located remotely from the processing chamber. In the example of FIG. 1, an in-situ plasma configuration is provided by removing baffles 135 such that the workpieces are exposed to ionized species along with neutral species.

Continuing with a description of FIG. 1, each workpiece 130 such as, for example, a semiconductor wafer is supported on a pedestal 136. Each pedestal may be useful in heating the workpiece to a desired temperature. Any suitable type of pedestal may be used. Lift pins 138 can be used to raise and lower each workpiece with respect to each of pedestals 136. The lift pins are shown in a retracted position such that each workpiece is supported on one of the pedestals. While only two lift pins are illustrated, in the present figure, per pedestal for purposes of illustrative simplicity, a minimum of three lift pins is required per pedestal. Another part of system 100 comprises an exhaust arrangement 140 that is used in producing a vacuum in chamber interior 108. For this purpose, exhaust gas 142 flows in a direction indicated by arrows. Exhaust arrangement 140 includes, for example, a flanged pump spool 144, which serves in the manner of a tailpiece, and which is attached to chamber bowl 104 in any suitable manner such as, for example, using a plurality of bolts (not shown). Sealing may be performed, for example, using an O-ring (not shown) between the flanged spool and chamber bowl. A gas box 150 controls the flow of process gas to each plasma source 132 via a gas supply arrangement 152. In the present example, a first gas supply line 154 and a second gas supply line 156 supply gas to gas supply box 150. Generally, the gas box includes a mass flow controller (MFC) for each gas that is supplied to the gas box such that flow is selectable in terms of gas volume per unit time. In this regard, MFCs generally convert mass flow into volume flow at the standard conditions of 0 degrees Centigrade and 1 atmosphere. Accordingly, gas flow is specified in terms of volume per unit time throughout this disclosure, as would be supplied, for example, by an MFC. It is noted that the MFCs have not been illustrated since they are well understood by those having ordinary skill in the art.

Figure 2:
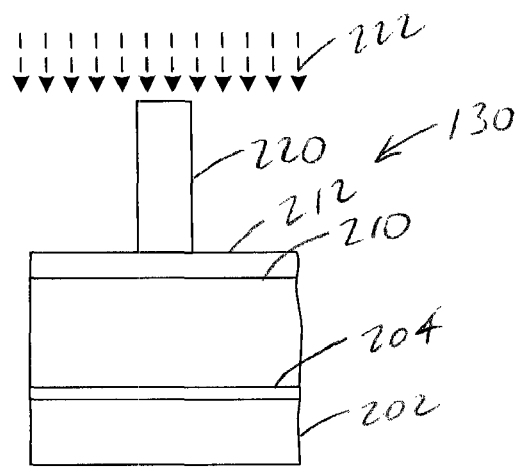
FIGS. 2-4 are diagrammatic cut-away views, in elevation, of a workpiece shown at an exemplary series of intermediate stages of fabrication which benefits from the practice of the present disclosure in relation to the formation of a gate electrode.

Turning now to FIG. 2, attention is directed to a first application of the present disclosure in which one of workpieces 130 is shown at an intermediate stage of fabrication and in a fragmentary elevational view in order to illustrate its layered structure. In particular, the process that is illustrated is useful in forming the gate electrode of a transistor such as, for example, a MOSFET transistor. The workpiece includes a substrate 202 that can be a silicon wafer. Other suitable substrates may be used such as, for example, silicon-on-insulator (SOI), quartz, or silicon-germanium, gallium nitride and related III-IV compounds. A gate oxide layer 204 is formed on a major surface of substrate 202 in a suitable manner such as, for example, by thermal oxidation. A tungsten layer 210 is then formed on gate oxide layer 204, for example, by sputtering deposition. Tungsten is used for reasons which include its low resistance as well as its work function match to the underlying high-k dielectric layer. A hard mask layer 212 is then formed on tungsten layer 210. The hard mask can be silicon oxide or silicon nitride formed by chemical vapor deposition. It should be appreciated that all of these layers can initially be formed on the entire lateral extents of the major surface of the workpiece. A patterned film of photoresist 220 is supported on hardmask 212 and formed, for example, by photolithography, for purposes of protecting an underlying region of the workpiece from a plasma etching process during which an anisotropic etch is performed using a plasma 222 that is shown as a series of dashed arrows. Any suitable plasma constituents may be used such that the plasma is selective to gate oxide 204. Further, acceleration can be used by applying radio frequency energy to workpiece supports 136 of FIG. 1 in a manner that is familiar to those having ordinary skill in the art.

Figure 3:
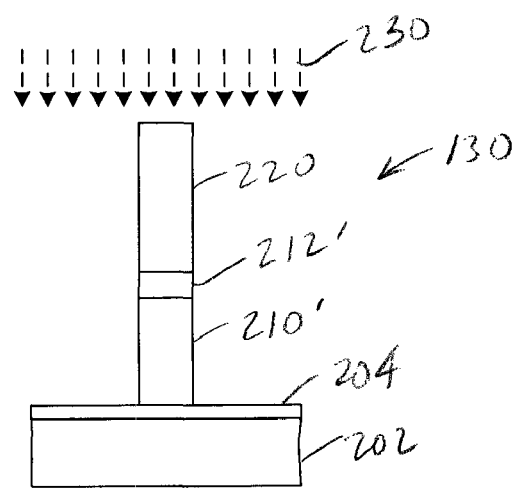

Turning now to FIG. 3, which is another fragmentary elevational view of the layered structure of workpiece 130, the exposure of the workpiece to plasma 222 results in removal of areas of hard mask 212 and tungsten layer 210 that are not directly below photoresist 220. Accordingly, a portion 212' of the hard mask and a portion 210' of the tungsten layer remain positioned below photoresist 220. Workpiece 130 is then exposed to a plasma 230 that is shown as a series of dashed arrows for removing photoresist 220. Plasma 230 is formed from oxygen ($O_2$) gas and hydrogen ($H_2$) gas that can be provided to gas box 150 using gas supply lines 154 and 156, respectively. In an in-situ plasma configuration, workpiece 130 and photoresist 220 can be exposed to neutral species and ionized species that are formed from the oxygen and hydrogen gas. In a downstream plasma configuration, workpiece 130 and photoresist 220 can be exposed to neutral species that are formed from the oxygen and hydrogen species. That is, at least from a practical standpoint, all of the ionized species are removed from the plasma. The choice of an in-situ configuration versus a downstream configuration determines various aspects of the overall process, as will be discussed immediately hereinafter.

Table 1 illustrates process parameters when an in-situ plasma configuration is used. In the present example, an inductively coupled plasma (ICP) source was used, although any suitable plasma source, as discussed above.

TABLE 1

In-situ Plasma Configuration

| Parameter | Value |
| --- | --- |
| Temperature | ~20° C. (Low) |
| Pressure | 30-50 mTorr |
| Plasma Source Power | 1000-1500 Watts |
| Bias Power to Pedestal | 0-100 Watts |
| Total Gas Flow | 500-1000 sccm |
| Hydrogen Content | ~20%-30% of total gas flow |

The process time will depend upon factors such as, for example, the thickness of the photoresist to be removed. In the present example, removal rates of greater than 18000 angstroms per minute were achieved for an in-situ plasma configuration.

Table 2 illustrates process parameters when a downstream plasma configuration is used. In the present example, an ICP plasma source was used, however, any suitable plasma source can be used, as discussed above.

TABLE 2

Downstream Plasma Configuration

| Parameter | Value |
| --- | --- |
| Temperature | ~250° C. to ~300° C. |
| Pressure | 500-1000 mTorr |
| Plasma Source Power | 2000-3000 Watts |
| Total Gas Flow | 1000-5000 sccm |
| Hydrogen Content | ~10%-15% of total gas flow |

Once again, the process time will depend upon factors such as, for example, the thickness of the photoresist to be removed. In the present example, removal rates of greater than 18,000 angstroms per minute were achieved for a downstream plasma configuration, as will be further described below.

Figure 4:
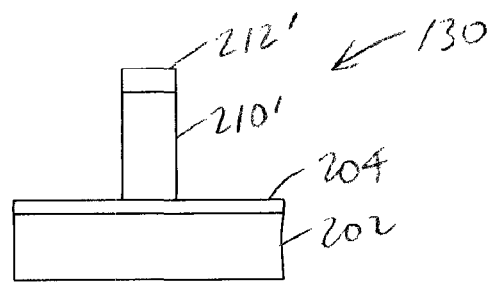

FIG. 4 is still another fragmentary elevational view of workpiece 130 following removal of photoresist 220 (FIG. 3). As seen, the photoresist stripping process in either an in-situ or downstream configuration exhibits high selectivity between the photoresist and each of hard mask 212', gate oxide 204 and tungsten 210'. That is, the photoresist is removed at better than acceptable rates while the hard mask, gate oxide and tungsten are essentially unaffected, at least from a practical stand point. In this regard, empirical results demonstrate that there is virtually no loss of tungsten when the process is practiced according to this disclosure while high photoresist removal rates are achieved. Applicants are unaware of any process in the prior art that is able to demonstrate this level of selectivity between photoresist and tungsten. Subsequent to producing the structure of FIG. 4, hard mask 212' can be removed such that tungsten 210' functions as the gate electrode in an overall transistor structure. It should be appreciated that the described procedure can enjoy applicability in any situation where there is a need to strip photoresist in the presence of tungsten and that the present example is not intended to be limiting in this regard.

With reference to the gas mixtures that are used in generating plasma 230, as exemplified by Tables 1 and 2, it is noted that hydrogen can be problematic on the basis of its flammability at concentrations above approximately 4%. Flammability of hydrogen and oxygen gas mixtures are dependent on other factors including pressure temperature, water vapor content and ignition energy. One useful system that can be employed for purposes of handling this mixture is described in U.S. Published Application No. 2005/0196967, corresponding to U.S. application Ser. No. 11/039,537 (hereinafter the '537 Application) which is commonly owned with the present application and incorporated herein by reference. In particular, FIG. 4 of the '537 Application illustrates a system having a double load locked configuration that helps to avoid hydrogen release.

Figure 5:
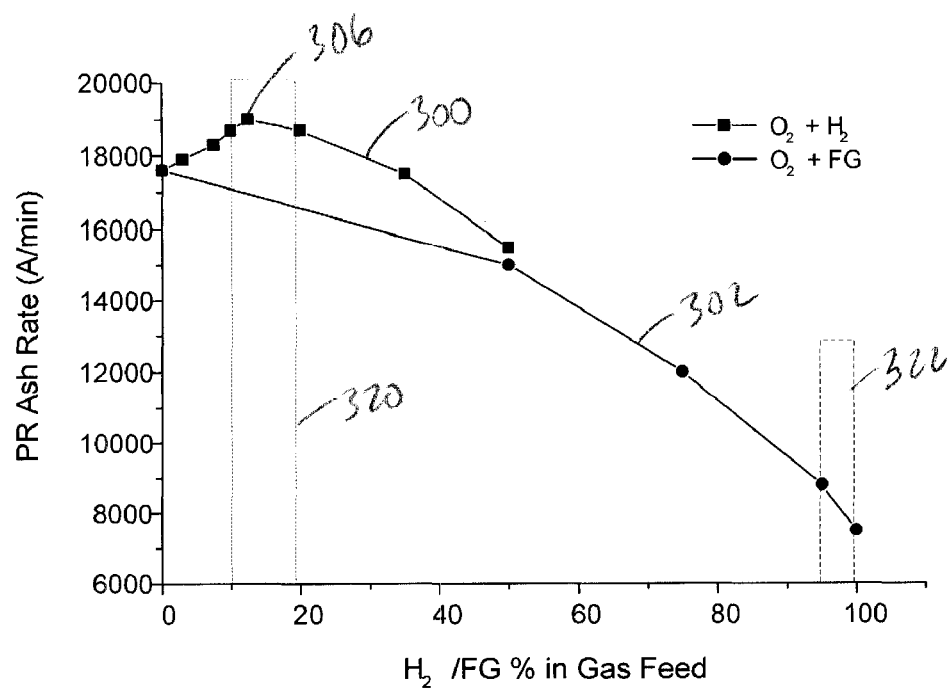
FIG. 5 is a graph illustrating photoresist ash rate versus percentage of hydrogen in the input gas mixture in one case and versus percentage of forming gas in the input gas mixture in another case, shown here to illustrate the difference in ash rate for the different gas constituents.

Turning to FIG. 5 and having described embodiments for removing photoresist in the presence of tungsten in detail above, attention is now directed to empirical results in the application of the process. FIG. includes a plot 300 of photoresist ash rate in angstroms per minute for hydrogen as a volumetric percentage of the input gas mixture and a plot 302 of photoresist ash rate in angstroms per minute for forming gas (FG) as a volumetric percentage of the input gas mixture. In this latter case, the FG includes 4% hydrogen by volume. Plots 300 and 302 have been provided for purposes of comparison in demonstrating what are considered as sweeping improvements over the combination of oxygen and forming gas. In order to make the most effective comparison, process conditions were matched as closely as practical in developing the two plots. For plot 300, the pressure was 800 mTorr, source power was 2500 W, total flow rate of oxygen and hydrogen was 2000 sccm, and temperature was 300 degrees C. A downstream processing configuration was used such that these process conditions are consistent with Table 2. For plot 302, the pressure was 800 mTorr, source power was 2500 W, total flow rate of oxygen and FG was 2000 sccm, and temperature was 300 degrees C. A downstream plasma configuration was also used. It is of interest that plot 300 demonstrates a peak 306 in the strip or ashing rate at around 13 percent $H_2$. The strip rate for plot 302 using the combination of oxygen and FG demonstrates a decrease in strip rate with rising percentage of forming gas.

Figure 6:
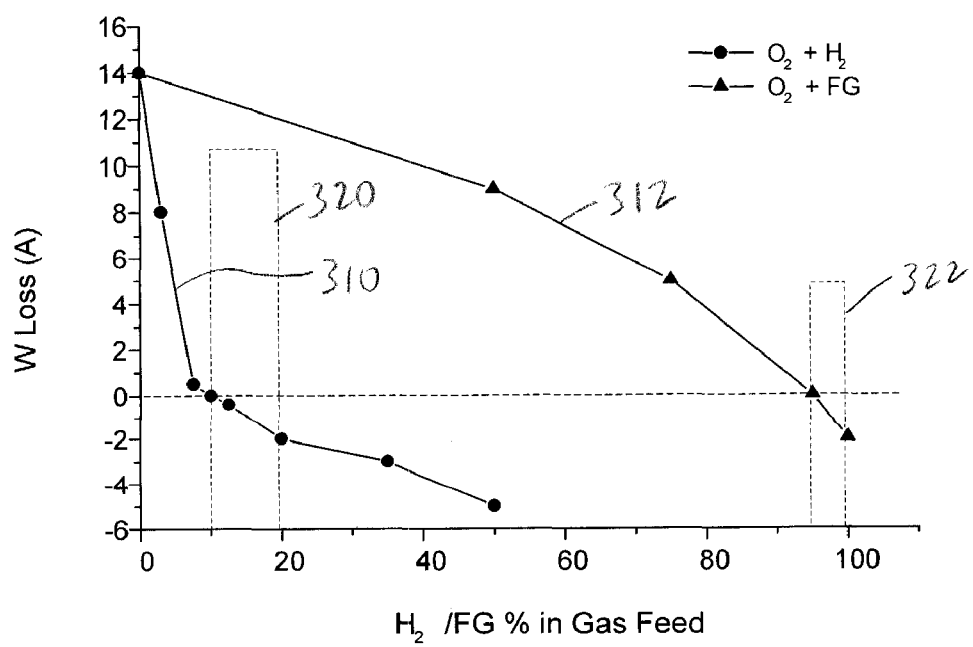
FIG. 6 is another graph illustrating tungsten loss versus percentage of hydrogen in the input gas mixture in one case and versus percentage of forming gas in the input gas mixture in another case, shown here to illustrate tungsten loss corresponding to the plots of FIG. 5.

Referring to FIG. 6 in conjunction with FIG. 5, the former includes a first plot 310 of tungsten loss in angstroms against percentage of hydrogen in the input gas mixture with oxygen making up the remainder of the gas flow and a second plot 312 of tungsten loss in angstroms against percentage of FG in the input gas mixture with oxygen making up the remainder of the gas flow. It is noted that the tungsten loss represents the total amount of tungsten loss that occurs over the duration of the photoresist stripping process of 120 seconds. Plot 310 demonstrates a rapid decrease in tungsten loss with the initial addition of hydrogen. In fact, the tungsten loss drops to a value of zero at approximately 10% hydrogen. Remarkably, the plot proceeds into a negative range, which seems to demonstrate that the tungsten layer is growing in thickness. In this regard, the tungsten on the workpiece that was processed included a native oxide layer that was not removed in advance for purposes of simplification of the process. Accordingly, plot 310 with negative tungsten loss above about 10% hydrogen, demonstrates that the native tungsten oxide is converted or reduced back into tungsten. Surprisingly, the process in this regard is so powerful so as to not only be capable of reducing tungsten loss to zero by avoiding oxidation of the tungsten but to be able to actually reduce a native tungsten oxide layer back into tungsten. Remarkably, peak 306 of FIG. 5 is offset only slightly, by a few percentage points of hydrogen gas input, from the zero tungsten loss value. On this basis, high photoresist strip rates can be accompanied by very low or no tungsten loss by operating at least approximately in a hydrogen/oxygen ($H_2/O_2$) zero tungsten loss process region 320. FIGS. 5 and 6 demonstrate that, for zero loss process region 320, the photoresist strip rate is near 19,000 angstroms per minute and the tungsten loss is zero, respectively. Further, oxidized tungsten that is present can be converted back into tungsten.

It is worthwhile to provide some additional detail with respect to the ability of the process described herein to reduce tungsten oxide and prevent tungsten oxidation. One would expect that a radical-based process with a mixture having predominantly oxygen in the feed gas would have more oxygen atoms available than hydrogen atoms in the gas phase and would promote a net tungsten reaction with oxygen to form tungsten oxides. One would expect that hydrogen would be able to reduce such oxidation when the feed gas contains more hydrogen than oxygen, since hydrogen atoms would then be able to be more available to react with the Tungsten oxide than oxygen atoms reacting to cause oxidation. The results that have been empirically demonstrated by Applicants are unexpected and surprising with such low levels of hydrogen, as low as 10%, since much more hydrogen should be needed in order to protect the tungsten and reduce tungsten oxide based on the typical chemistry that takes place between these components and as would be understood by one of ordinary skill in the art.

Still referring to FIGS. 5 and 6, differences in process results will be discussed in further detail in consideration of the use of forming gas. In this regard, plot 312 of FIG. 6 demonstrates a gradual reduction in tungsten loss with increasing percentage of FG and the plot does not reach zero tungsten loss until the FG percentage in the input gas mixture is above 90%. At this level of forming gas in the input gas mixture, hydrogen makes up only about 4% of the overall gas mixture. Accordingly, for the use of FG with oxygen, a FG/oxygen, zero tungsten loss region 322 is provided. While tungsten loss is essentially eliminated in region 322 and tungsten oxide can be reduced to tungsten, FG/oxygen zero loss region 322 is dramatically laterally offset from the high photoresist strip rate area of plot 302. Unfortunately, for zero tungsten loss region 322, FIG. 5 demonstrates that the photoresist strip rate is reduced to about 9,000 angstroms per minute, which is less than one half the strip rate that is achieved by the $H_2/O_2$ process at 10% hydrogen. In shifting to the high strip rate portion of plot 302, the increase in strip rate is accompanied by a dramatic rise in tungsten loss. In particular, the strip rate for 10% FG is slightly greater than 17,000 angstroms per minute with a corresponding tungsten loss, seen in plot 312, that is considered as extremely high, at about 13 angstroms for 10% FG. This level of tungsten loss is considered to be unacceptable. It is believed that adding nitrogen, via forming gas or otherwise, causes the high strip rate region and the low tungsten loss region to shift apart from one another. This shift is likely to increase in proportion to increasing amounts of nitrogen and may not introduce significant losses in process results when low levels of nitrogen are used, for example, below about 20%. In effect, such levels of nitrogen are an insubstantial constituent of the plasma. Accordingly, in one embodiment, the process is practiced with no added nitrogen or other added gases. While not intending to be bound by theory, it is expected that added nitrogen will lower the effect of hydrogen in H2/O2 mixture in preventing tungsten oxidation.

As noted above, the overlap of high strip rates and low or no tungsten loss for the hydrogen/oxygen based process is considered to be highly advantageous. In the $H_2/O_2$ zero tungsten loss process regime, the strip rate for 10% hydrogen is about 18,750 angstroms per minute. In the $FG/O_2$ zero tungsten loss process regime, the strip rate is slightly greater than 17,000 angstroms per minute. The difference between these two strip rates is not particularly significant. What is significant, however, is the difference between tungsten loss at these acceptable levels of strip rates.

Referring to FIGS. 5 and 6, as discussed above, a downstream plasma configuration was used in producing this empirical data. Applicants have discovered that, when an in-situ plasma configuration is used, a peak does not develop in the strip rate response. Nevertheless, a zero tungsten loss region, similar to region 320, continues to coincide with reasonably high photoresist strip rates, resulting in an effective process.

Figure 7:
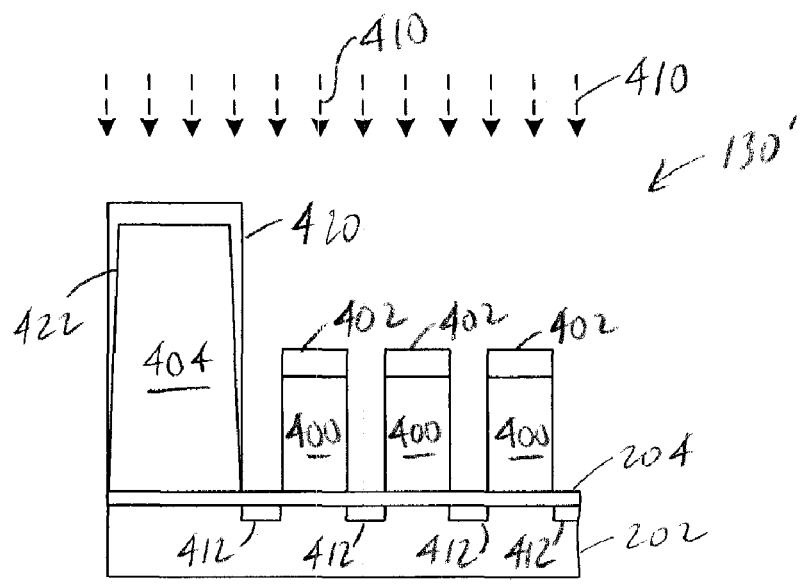
FIGS. 7-9 are diagrammatic cut-away views, in elevation, of a workpiece shown at an exemplary series of intermediate stages of fabrication which benefits from the practice of the present disclosure in relation to removal of photoresist following ion implantation in the presence of tungsten or tungsten containing gate electrodes.

Turning now to FIG. 7, attention is directed to a second application of the present disclosure in which one of workpieces 130' is shown at an intermediate stage of fabrication in a fragmentary elevational view in order to illustrate its layered structure. In particular, the process that is illustrated relates to the formation of source and drain regions of integrated MOS transistors. As in the previous example, the workpiece includes substrate 202 that can be a silicon wafer. Similarly, other suitable substrates may be used. Gate oxide layer 204 is again formed on the major surface of substrate 202. A number of gate electrodes, each of which is indicated by the reference number 400, are formed on gate oxide layer 204, for example, in the manner described with regard to FIGS. 2-4, such that each gate electrode 400 supports a hard mask 402, which is comparable with the portion of the hard mask layer that is indicated by the reference number 212' in FIG. 4. Adjacent to gate electrodes 400, a portion 404 of a patterned layer of photoresist protects an underlying region of substrate 202 from an ion implantation process in which bombarding ions 410, indicated by a series of arrows, are incident upon the workpiece to form doped regions 412 in substrate 202. It is noted that the implanted species pass through gate oxide layer 204. Further, in a high dose ion implantation process, an implant crust can be formed on the exterior surfaces of photoresist 404 and, most particularly, on the surface of the photoresist that confronts the bombarding dopant species, as will be described in detail immediately hereinafter.

Generally, the complete removal of photoresist is difficult where the top layer of the PR has been subjected to very substantial ion bombardment (during ion implant doping) that is believed to cause most hydrogen in the polymer to be lost and the carbon in the polymer to cross-link. The toughness of the top layer of the implanted photoresist (implant crust) is well known, and can make the implant crust more resistant to the chemical attack that is commonly used to strip the photoresist. The physical structure of photoresist 404 after high dose ion implantation is shown in FIG. 7. A first, outer layer 420 is a hardened crust which received most of the ion dose when in use as a mask during implantation, as illustrated. Research has shown that the crust is a graphitic, highly cross-linked, and predominantly a carbon polymer when the dose of ions is equal to or greater than $10^{15}$ per centimeter squared. Typically, the implanted ion energy is such that the ions do not penetrate more than a fraction of the thickness of the photoresist mask. Consequently, the ion-damaged crust is only a fraction of the thickness of the photoresist and has been exaggerated in the figures for illustrative purposes. The remaining photoresist, so called "bulk" photoresist which has not been ion implanted, is indicated by the reference number 422. It can be seen that the implant crust and the bulk photoresist contact silicon gate oxide 204, with the crust partially or completely enveloping the bulk.

Figure 8:
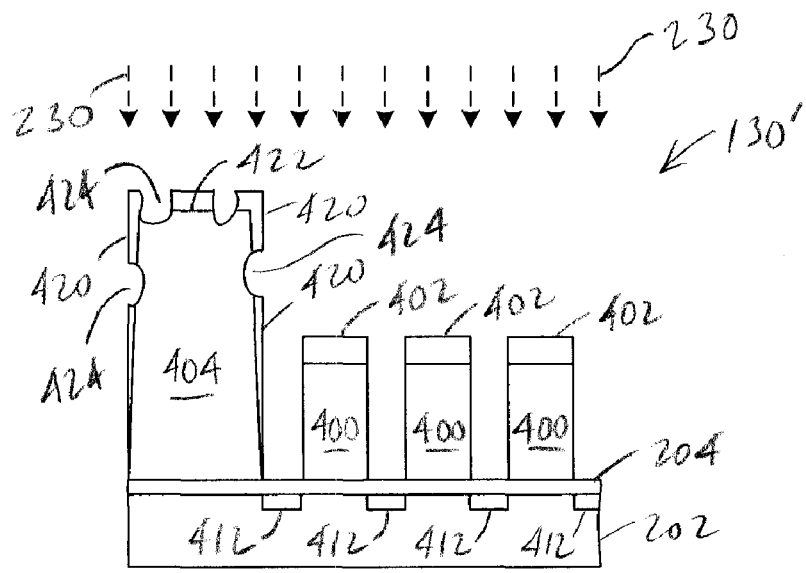

Turning now to FIG. 8, workpiece 130' is shown in another fragmentary elevational view of its layered structure following the ion implantation process of FIG. 7 such that photoresist 404 supports implant crust 422 and implanted regions 412 are present. Further, the workpiece is exposed to plasma 230. The choice of an in-situ configuration versus a downstream configuration determines various aspects of the overall process, as described above. Plasma 230 has been found to be effective in removing photoresist having an implant crust using either an in-situ or downstream plasma configuration, as demonstrated by voids 424 formed in the photoresist. Further, removal of such photoresist is accomplished with little or no damage to tungsten gate electrodes 400. In this regard, it should be appreciated that process time for removing the photoresist can be extended based on the thickness of the photoresist or the presence of an implant crust with no risk of damage to any tungsten that is present since the process operates in a zero tungsten loss regime.

Figure 9:
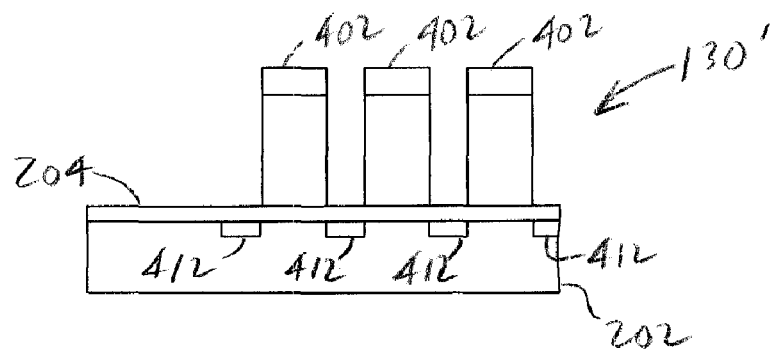

FIG. 9 illustrates the structure of workpiece 130' in still another fragmentary elevational view, following removal of the photoresist. Tungsten gate electrodes 400 are undamaged. Subsequent to producing the structure of FIG. 9, hard mask 402 can be removed such that each tungsten gate electrode 400 can function as the gate electrode in an overall transistor structure. It should be appreciated that the described procedure can enjoy applicability in any situation where there is a need to strip photoresist in the presence of tungsten and that the present example is not intended to be limiting in this regard.

Figure 10:
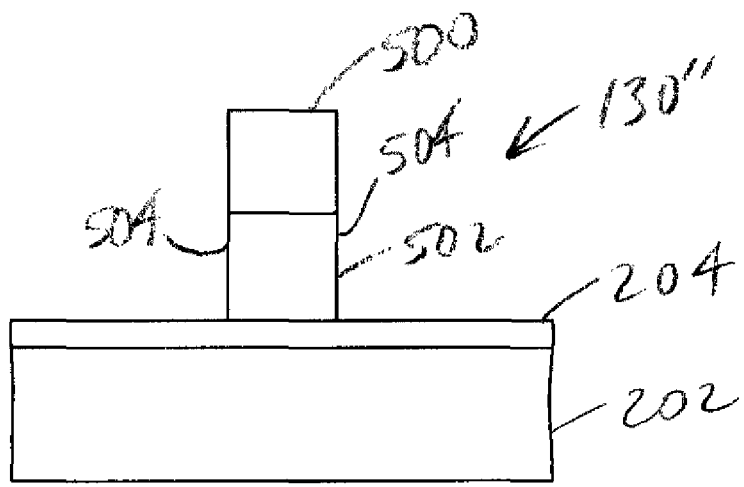
FIGS. 10 and 11 are diagrammatic cut-away views, in elevation, of a workpiece shown at an exemplary series of intermediate stages of fabrication which benefits from the practice of the present disclosure in relation to oxidizing polysilicon in the presence of tungsten.

Turning now to FIG. 10, attention is directed to a third application of the present disclosure in which one of workpieces 130'' is shown at an intermediate stage of fabrication in a fragmentary elevational view in order to illustrate its layered structure. In particular, the process that is illustrated relates to a gate electrode structure which includes a tungsten layer 500 that is supported by a polysilicon layer 502 having sidewalls 504 that are exposed. As in the previous examples, the workpiece includes substrate 202 that can be a silicon wafer. Similarly, other suitable substrates may be used. Gate oxide layer 204 is again formed on the major surface of substrate 202. It is noted that the structure of this workpiece resembles that of the workpiece of FIG. 4, with the exceptions of the addition of the polysilicon layer and the removal of etch stop layer 212' from the upper surface of tungsten 210'. As a result of the exposure of sidewalls 504 to processing conditions, the polysilicon can be damaged as the result of prior etching steps, for example, in removing an etch stop layer (see layer 212' of FIG. 4) or, in another example, as the result of prior removal of photoresist which may have been ion implanted. The effect of such damage can be to degrade the performance characteristics of the gate electrode, for example, by increasing current leakage between the gate and the drain. By oxidizing the polysilicon surface the effect of this damage can be reduced.

Figure 11:
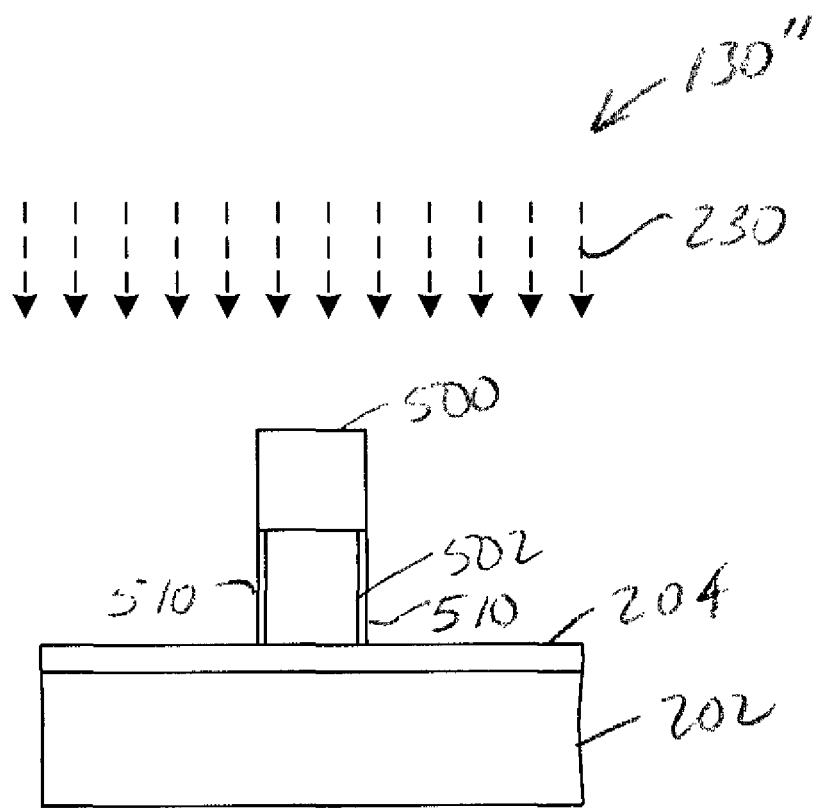

Referring to FIG. 11, in conjunction with FIG. 10, workpiece 130'' is subjected to plasma 230 in either a downstream or in-situ configuration to produce oxidation in the form of a layer of silicon oxide 510 on the exposed sidewalls of polysilicon 502. The formation of silicon oxide layers 510 serves to restore the desired characteristics of the gate electrode, such as decreasing its electrical resistance. At the same time, plasma 230, as can be appreciated from the foregoing descriptions, causes no oxidation loss of tungsten 500 and can reduce tungsten oxide that might be present back into tungsten. In this regard, the use of plasma 230 can be beneficial under other circumstances where it is desired to avoid oxidation of tungsten while some other material is subjected to oxidation. Further, plasma 230 can be applied for the purpose of reducing existing tungsten oxide, native or otherwise.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method for removing photoresist from a workpiece during an intermediate stage of processing when a region of tungsten is exposed as part of the workpiece, said method comprising:

generating a plasma from a gas input consisting essentially of hydrogen gas and oxygen gas in a predetermined ratio; and exposing the workpiece to the plasma such that said predetermined ratio causes the photoresist to be substantially removed from the workpiece while the region of tungsten is left substantially the same as prior to the exposure to the plasma.

2. The method of claim 1 wherein said exposing results in essentially no loss of the tungsten by oxidation.

3. The method of claim 1 wherein said gas input is approximately nitrogen free.

4. The method of claim 1 wherein said gas input includes no more than 20 percent of nitrogen as part of a total flow rate of the gas input.

5. The method of claim 1 wherein said gas input includes hydrogen gas at a rate of flow of 20% to 30% of a total flow rate of the gas input, in said predetermined ratio, when said plasma is generated by an in-situ plasma reactor.

6. The method of claim 5 wherein said total flow rate is at least approximately 500-1000 sccm.

7. The method of claim 1 wherein said gas input includes hydrogen gas at a rate of flow of 10% to 15% of a total flow rate of the gas input, in said predetermined ratio, when said plasma is generated by a downstream plasma reactor.

8. The method of claim 7 wherein said total flow rate is at least approximately 1000 sccm to 5000 sccm.

9. The method of claim 1 wherein said tungsten region forms part of a gate electrode structure with a major surface of the tungsten region subject to said exposing as the photoresist is removed.

10. The method of claim 1 wherein said photoresist includes a crust previously formed by a high dose ion implantation and said exposing removes the crust.

11. A method for removing photoresist from a workpiece during an intermediate stage of processing when a region of tungsten is exposed as part of the workpiece, said method comprising:
 providing a downstream plasma system for exposing the workpiece to a downstream plasma;
 feeding a gas mixture to the downstream plasma system for generating said downstream plasma and exposing the workpiece to the downstream plasma;
 using hydrogen gas and oxygen gas as the gas mixture for generating the downstream plasma to remove said photoresist such that a removal rate of said photoresist changes with changes in a ratio of the hydrogen gas to the oxygen gas and a loss of said tungsten during the removal of the photoresist changes with changes in said ratio; and
 adjusting the ratio of the hydrogen gas to the oxygen gas to a particular value which causes the photoresist to be removed at about a maximum removal rate that corresponds to a minimum tungsten loss rate of about zero.

12. The method of claim 11 wherein the gas mixture consists of hydrogen gas and oxygen gas.

13. The method of claim 11 wherein changing the ratio of the hydrogen gas to the oxygen gas defines a peak in the removal rate of the photoresist at about said particular value of said ratio.

14. The method of claim 11 wherein the removal rate of the photoresist is within 5 percent of the maximum removal rate and the tungsten loss rate is less than 1 Å at said particular value of the ratio.

* * * * *